(12) United States Patent
Yamasaki et al.

(10) Patent No.: US 7,189,431 B2
(45) Date of Patent: Mar. 13, 2007

(54) METHOD FOR FORMING A PASSIVATED METAL LAYER

(75) Inventors: Hideaki Yamasaki, Yamanashi (JP); Kazuhito Nakamura, Guilderland, NY (US); Yumiko Kawano, Yamanashi (JP); Gert J. Leusink, Saltpoint, NY (US); Fenton R. McFeely, Ossining, NY (US); Paul Jamison, Hopewell Junction, NY (US)

(73) Assignees: Tokyo Electron Limited, Tokyo (JP); International Business Machines Corp., Armonk, NY (US)

( * ) Notice: Subject to any disclaimer, the term of this patent is extended or adjusted under 35 U.S.C. 154(b) by 0 days.

(21) Appl. No.: 10/711,717

(22) Filed: Sep. 30, 2004

(65) Prior Publication Data

US 2006/0068097 A1 Mar. 30, 2006

(51) Int. Cl.
*C23C 16/16* (2006.01)

(52) U.S. Cl. ............... 427/250; 427/250; 427/255.29; 427/255.31; 427/255.394; 427/255.7; 427/383.1

(58) Field of Classification Search ............ 427/250, 427/249.1, 255.394, 255.29, 255.31, 255.7, 427/383.1; 438/287, 592
See application file for complete search history.

(56) References Cited

U.S. PATENT DOCUMENTS

| 5,169,685 | A | * | 12/1992 | Woodruff et al. | ............ 427/250 |
| 5,209,388 | A | * | 5/1993 | Mittendorf et al. | ......... 228/121 |
| 5,577,263 | A | * | 11/1996 | West | ............ 428/552 |
| 5,780,157 | A | * | 7/1998 | Tuffias et al. | ............ 428/408 |
| 5,952,421 | A | * | 9/1999 | Bradley et al. | ............ 524/588 |
| 6,238,737 | B1 | | 5/2001 | Chan et al. | ............ 427/255.18 |
| 6,540,800 | B2 | * | 4/2003 | Sherman et al. | ............ 51/309 |
| 6,596,602 | B2 | * | 7/2003 | Iizuka et al. | ............ 438/396 |
| 6,884,466 | B2 | * | 4/2005 | Kaloyeros et al. | .... 427/255.392 |
| 6,921,469 | B2 | * | 7/2005 | Larsen | ............ 204/290.12 |
| 6,921,711 | B2 | * | 7/2005 | Cabral et al. | ............ 438/589 |
| 2003/0098489 | A1 | | 5/2003 | Amos et al. | |
| 2003/0235526 | A1 | | 12/2003 | Vanderspurt et al. | |

FOREIGN PATENT DOCUMENTS

| EP | 629002 A1 | 12/1994 |
| WO | WO03056612 A1 | 7/2003 |
| WO | WO2005033357 A2 | 4/2005 |

OTHER PUBLICATIONS

International Search Report and Written Opinion, European Patent Office, Issued Jan. 25, 2006, 9 pp.

* cited by examiner

*Primary Examiner*—Bret Chen
(74) *Attorney, Agent, or Firm*—Wood, Herron & Evans, LLP (57) ABSTRACT

A method for forming a passivated metal layer that preserves the properties and morphology of an underlying metal layer during subsequent exposure to oxygen-containing ambients. The method includes providing a substrate in a process chamber, exposing the substrate to a process gas containing a rhenium-carbonyl precursor to deposit a rhenium metal layer on the substrate in a chemical vapor deposition process, and forming a passivation layer on the rhenium metal layer to thereby inhibit oxygen-induced growth of rhenium-containing nodules on the rhenium metal surface.

16 Claims, 5 Drawing Sheets

METHOD FOR FORMING A PASSIVATED METAL LAYER

FIELD OF THE INVENTION

The present invention relates to passivating deposited rhenium (Re) metal layers during semiconductor processing, and more particularly to forming a passivation layer on a deposited rhenium metal layer to inhibit oxygen-induced growth of rhenium-containing nodules on the rhenium metal surface.

BACKGROUND OF THE INVENTION

The minimum feature sizes of microelectronic devices are approaching the deep sub-micron regime to meet the demand for faster, lower power microprocessors and digital circuits. The introduction of copper (Cu) metal into multi-layer metallization schemes for manufacturing integrated circuits can necessitate the use of diffusion barriers/liners to promote adhesion and growth of the Cu layers, and to prevent diffusion of Cu into the dielectric materials. Barriers/liners that are deposited onto dielectric materials can include refractory materials, such as tungsten (W), rhenium (Re), ruthenium (Ru), molybdenum (Mo), and tantalum (Ta), that are non-reactive and substantially immiscible with Cu and can offer low electrical resistivity. Current integration schemes that integrate Cu metallization and dielectric materials can require barrier/liner deposition processes that can be performed at low substrate temperatures. Another application of refractory materials in emerging microelectronic devices includes metal gate electrodes in conjunction with high-permittivity dielectric materials (also referred to herein as "high-k" materials). Metal gates are expected to provide a range of benefits for gate-stack scaling such as eliminating the poly-silicon depletion effect. Successful integration of metal layers as metal gates and metal barriers/liners in semiconductor devices requires sufficiently high deposition rates at low or moderate substrate temperatures, low electrical resistivity, low stress of the deposited metal layers, good adhesion of the metal layers to underlying and overlying materials, good thickness uniformity, low contaminant levels, and good layer morphology including low surface roughness.

A Re metal layer can be deposited by low temperature thermal chemical vapor deposition from a Re-carbonyl precursor. However, the Re-carbonyl precursor is subject to incomplete decomposition, resulting in reaction by-products that can be adsorbed into the Re metal layer or on the surface of the Re metal layer. During a subsequent exposure of the Re metal layer to ambient atmosphere, Re-oxide nodules form on the surface of the Re metal layer, where the formation of the nodules is promoted by the by-products present in the surface of the metal layer with the oxygen in air. These nodules may adversely affect the properties and morphology of the Re metal layer.

There is thus a need to avoid nodule formation on the surface of a Re metal layer upon exposure of the metal layer to oxygen.

SUMMARY OF THE INVENTION

The present invention provides a method for forming a passivated metal layer that preserves the properties and morphology of a Re metal layer during subsequent exposure to oxygen-containing ambients. The method includes providing a substrate in a process chamber, exposing the substrate to a process gas containing a Re-carbonyl precursor to deposit a Re metal layer on the substrate in a chemical vapor deposition process, and forming a passivation layer on the Re metal layer to inhibit oxygen-induced growth of Re-containing nodules on the Re metal surface.

The present invention further provides a computer readable medium containing program instructions for execution on a processor to thereby perform the method of depositing a Re metal layer on a substrate from a Re-carbonyl precursor in a chemical vapor deposition process, and forming a passivation layer on the surface of the Re metal layer to thereby inhibiting oxygen-induced growth of Re-containing nodules on the metal surface.

DETAILED DESCRIPTION OF SEVERAL EMBODIMENTS OF THE INVENTION

Figure 1:
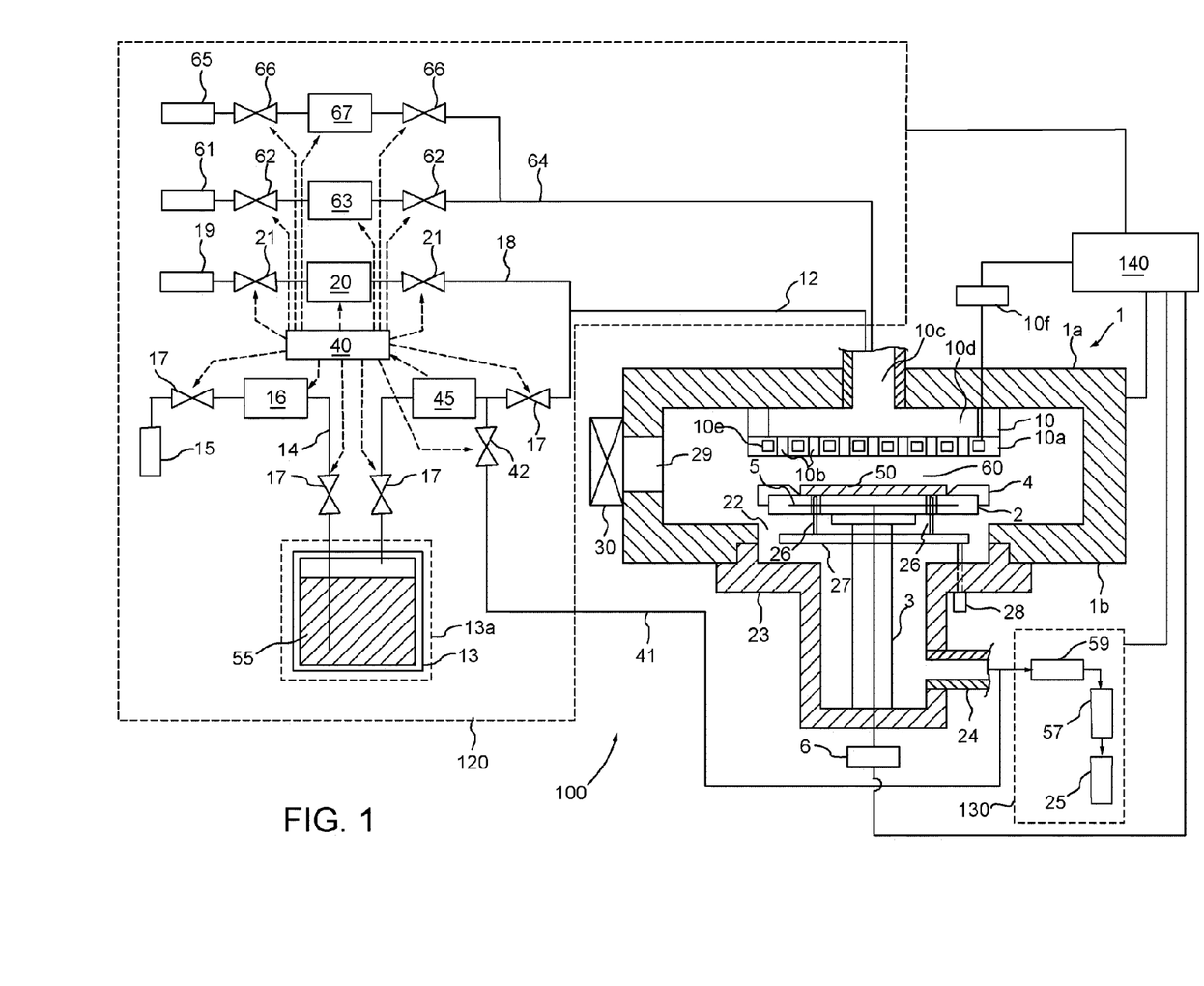
FIG. 1 is a simplified block-diagram of a processing system for forming a passivated metal layer according to an embodiment of the invention.

FIG. 1 is a simplified block-diagram of a processing system for forming a passivated metal layer according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater or any other type of heater.

The heated substrate 50 can thermally decompose a metal-carbonyl gas to deposit a metal layer on the substrate 50. The substrate holder 2 is heated to a pre-determined temperature that is suitable for depositing the desired metal layer onto the substrate 50. A heater (not shown) is embedded in the walls of process chamber 1 to heat the chamber walls to a pre-determined temperature. The heater can maintain the temperature of the walls of process chamber 1 from about 40° C. to about 200° C.

A showerhead 10 is located in the upper chamber section 1a of process chamber 1. Showerhead plate 10a at the bottom of showerhead 10 contains multiple gas delivery holes 10b for delivering a process gas comprising the metal-carbonyl precursor gas into a processing zone 60 located above the substrate 50.

An opening 10c is provided in the upper chamber section 1b for introducing a process gas from gas line 12 into a gas distribution compartment 10d. Concentric coolant flow channels 10e are provided for controlling the temperature of the showerhead 10 and thereby preventing the decomposition of the metal-carbonyl precursor gas inside the showerhead 10. A coolant fluid, such as water, can be supplied to the coolant flow channels 10e from a coolant fluid source 10f for controlling the temperature of showerhead 10 from about 20° C. to about 200° C.

The gas line 12 connects the precursor delivery system 120 to process chamber 1. A precursor container 13 contains a metal-carbonyl precursor 55, and a precursor heater 13a is provided for heating the precursor container 13 to maintain the metal-carbonyl precursor 55 at a temperature that produces a desired vapor pressure of the metal-carbonyl precursor.

In one embodiment of the invention, a carrier gas (e.g., argon (Ar) or helium (He)) can be used to enhance the delivery of the metal-carbonyl precursor to the process chamber 1. Alternatively, the metal-carbonyl precursor can be delivered to the process chamber 1 without the use of a carrier gas. Gas line 14 can provide a carrier gas from gas source 15 to the precursor container 13, and a mass flow controller (MFC) 16 and valves 17 can be used to control the carrier gas flow rate. When a carrier gas is used, it may be introduced into the lower part of precursor container 13 so as to flow through the metal-carbonyl precursor 55. Alternatively, the carrier gas may be introduced into the precursor container 13 and distributed across the top of the metal-carbonyl precursor 55.

A sensor 45 is provided for measuring the total gas flow rate from the precursor container 13. The sensor 45 can, for example, comprise a MFC, and the amount of metal-carbonyl precursor gas delivered to the process chamber 1 can be determined and controlled using sensor 45 and MFC 16. Alternatively, the sensor 45 can comprise a light absorption sensor to measure the concentration of the metal-carbonyl precursor in the gas flow to the process chamber 1. In another embodiment of the invention, a liquid delivery system can be used to deliver the metal-carbonyl precursor gas to the process chamber 1.

A bypass line 41 is located downstream from sensor 45 and connects gas line 12 to exhaust line 24. Bypass line 41 is provided for evacuating gas line 12 and for stabilizing the supply of the metal-carbonyl precursor gas to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the metal-carbonyl precursor in the gas lines. The temperature of the gas lines can be controlled from about 20° C. to about 200° C., or from about 25° C. to about 150° C.

A dilution gas (e.g., Ar or He) can be supplied from gas source 19 to gas line 12 using gas line 18. The dilution gas can be used to dilute the process gas or to adjust the process gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the metal-carbonyl precursor gas, and a dilution gas. Sensor 45 is also connected to controller 40 and, based on output of the sensor 45, controller 40 can control the carrier gas flow rate through mass flow controller 16 to obtain the desired metal-carbonyl precursor gas flow rate to the process chamber 1.

Furthermore, a reducing gas (e.g., hydrogen ($H_2$)) can be supplied from gas source 61 to gas line 64, and a reactant gas for forming a passivation layer on a deposited metal layer can be supplied from gas sources 65 to gas line 64. MFCs 63 and 67, and valves 66 and 62 are controlled by controller 40, which controls the supply, shutoff, and the flow of the gases from gas sources 61 and 65.

Exhaust line 24 connects exhaust chamber 23 to vacuum pumping system 130. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump. Alternatively, the vacuum pump 25 can include a dry pump. During processing, the process gas can be introduced into the process chamber 1 and the chamber pressure adjusted by the APC 59. The APC 59 can comprise a butterfly-type valve or a gate valve. The trap 57 can collect un-reacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below the upper surface of substrate holder 2. A drive mechanism 28 utilizing, for example, an air cylinder provides means for raising and lowering the plate 27. A substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 140 includes a microprocessor, a memory, and a digital I/O port capable of generating control voltages sufficient to communicate and activate inputs of the processing system 100 as well as monitor outputs from the processing system 100. Moreover, the processing system controller 140 is coupled to and exchanges information with process chamber 1, precursor delivery system 120 that includes controller 40 and precursor heater 13a, vacuum pumping system 130, power source 6, and coolant fluid source 10f. In the vacuum pumping system 130, the processing system controller 140 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 140 is a DELL PRECISION WORKSTATION 610™, available from Dell Corporation, Austin, Tex.

Figure 2:
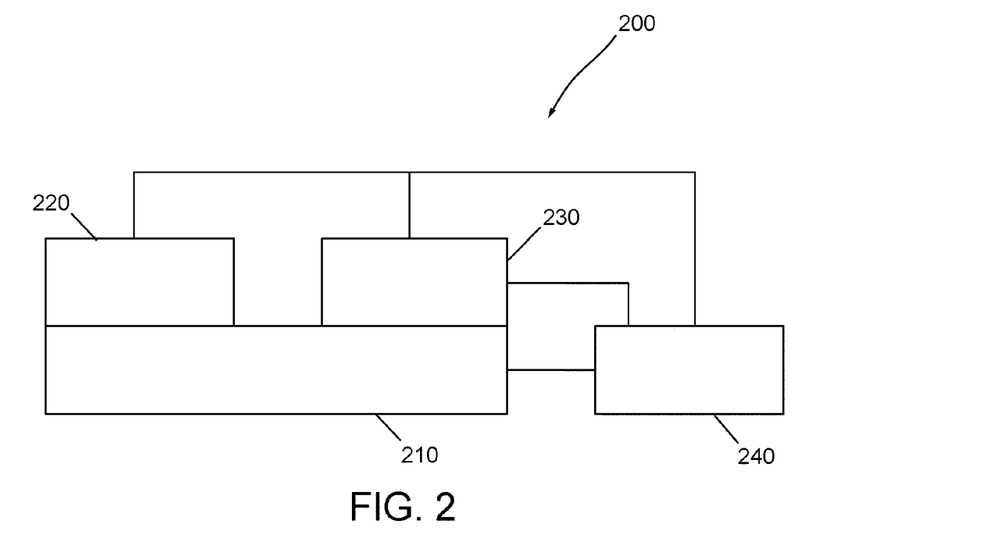
FIG. 2 shows a simplified block diagram of a processing tool for forming a passivated metal layer according to an embodiment of the invention.

FIG. 2 shows a simplified block diagram of a processing tool according to an embodiment of the invention. The processing tool 200 contains processing systems 220 and 230, a (robotic) transfer system 210 configured for transferring substrates within the processing tool 200, and a controller 240 configured to control the components of the processing tool 200. In an embodiment of the invention, the processing tool 200 can comprise a single processing system such as the exemplary processing system 100 depicted in FIG. 1 or, alternatively, the processing tool 200 can comprise more than two processing systems. In FIG. 2, the processing systems 220 and 230 can, for example, perform at least one of the following processes: deposit a metal layer on a substrate from a metal-carbonyl precursor gas in a chemical vapor deposition process, and form a passivation layer on the metal layer. The passivation layer can, for example, be formed in a thermal chemical vapor deposition process, an atomic layer deposition process, a plasma-enhanced chemical vapor deposition process, or a physical vapor deposition process. As with the controller 140 in FIG. 1, the controller 240 may be implemented as a DELL PRECISION WORKSTATION 610™. Moreover, the controller of either FIGS. 1 or 2 may be implemented as a general-purpose computer system such as that described below with respect to FIG. 6.

It is to be understood that the processing system in FIG. 1 and the processing tool in FIG. 2 are for exemplary purposes only, as many variations of the specific hardware and software can be used to implement systems in which the method of the present invention may be practiced, and these variations will be readily apparent to one having ordinary skill in the art.

In general, various metal layers can be deposited from the corresponding metal-carbonyl precursors. This includes deposition of W, Ru, Ni, Mo, Co, Rh, Re, Os, and Cr metal layers from $W(CO)_6$, $Ru_3(CO)_{12}$, $Ni(CO)_4$, $Mo(CO)_6$, $Co_2(CO)_8$, $Rh_4(CO)_{12}$, $Re_2(CO)_{10}$, $Os_3(CO)_{12}$, and $Cr(CO)_6$ precursors, respectively. The low-temperature deposition of low-resistivity metal layers from metal-carbonyl precursors allows integration of metal layers into back-end-of-line (BEOL) processing schemes that require low substrate temperatures.

Thermal decomposition of metal-carbonyl precursors and subsequent metal deposition, is thought to proceed predominantly by CO elimination and desorption of CO by-products from the substrate. Incorporation of CO by-products into the metal layers can result from incomplete decomposition of the metal-carbonyl precursor, incomplete removal of CO by-products from the metal layer, re-adsorption of CO by-products from the processing zone onto the metal layer, and adsorption of metal-carbonyl precursor from the background gas onto the deposited metal layer. Lowering of the process pressure results in a shorter residence of gaseous species (e.g., metal-carbonyl precursor, reaction by-products, carrier gas, and dilution gas) in the processing zone above the substrate, which in turn, can result in lower CO impurity levels in metal layers deposited on the substrate. In addition, lowering the partial pressure of the metal-carbonyl precursor in the processing zone can result in a lower deposition rate of the metal layer. A lower deposition rate can reduce the amount of reaction by-products that can become incorporated (trapped) in the metal layer by allowing more time for the by-products to desorb from the metal layer. Nonetheless, in the case of Re, unreacted precursor becomes trapped in the surface of the Re metal layer and the unreacted precursor and the Re metal layer may subsequently react with oxygen in air to form Re oxide nodules on the surface. Combined with the ease of oxidizing a Re metal, it is believed that the presence of unreacted precursor in the surface of the Re metal layer promotes the formation of the Re oxide nodules on the surface.

Figure 3A:
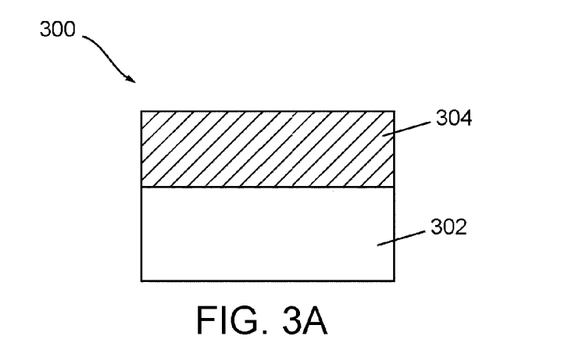
FIGS. 3A–3B show schematic cross-sectional views of a metal layer formed on a substrate.

FIG. 3A shows a schematical cross-sectional view of a metal layer on a substrate. The Re metal layer 304 is deposited from a Re-carbonyl precursor. In one example, a Re metal layer 304 was deposited on a substrate 302 in a processing system schematically shown in FIG. 1 by thermally decomposing a $Re_2(CO)_{10}$ precursor in a CVD process. Deposition conditions included a substrate temperature of 500° C., a process chamber pressure of 50 mTorr, precursor container temperature of 50° C., Ar carrier gas flow of 200 standard cubic centimeters per minute (sccm), and Ar dilution gas flow of 20 sccm. The deposited Re metal layer was about 150 Angstroms (Å) thick and the Re deposition rate was about 22 Å/min. The as-deposited Re metal layer showed good morphology with low surface roughness and electrical resistivity of about 61 microohm-cm.

In another example, the Re metal layer 304 was deposited at a substrate temperature of 420° C., a process chamber pressure of 50 mTorr, precursor container temperature of 60° C., Ar carrier gas flow of 200 sccm, and Ar dilution gas of 20 sccm. The deposited Re metal layer 304 showed good morphology with low surface roughness. The Re metal layer was about 150 Å thick and the Re deposition rate was about 53 Å/min.

Figure 3B:
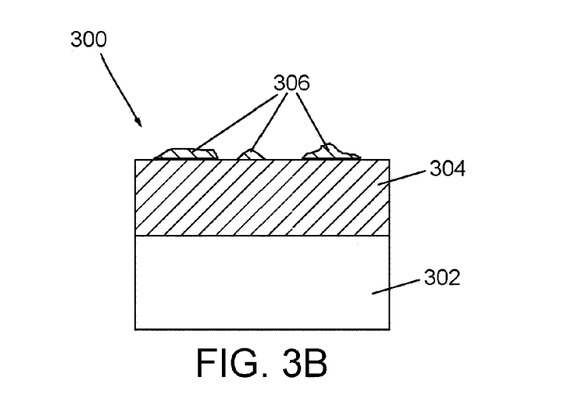

The morphology of the Re metal layer 304 in FIG. 3A was observed to deteriorate during exposure of the layer 304 to oxygen in the ambient air. FIG. 3B shows a schematical cross-sectional view of the substrate 302 containing a Re metal layer 304 and Re-containing nodules 306 on the surface of the Re metal layer 304. The nodules 306 were observed by scanning electron microscopy (SEM) following further exposure of the layer 304 to ambient air. In one example, the nodules 306 were several hundred nanometers in diameter and several tens of nanometers thick. Elemental analysis showed that the nodules contained Re and O. Based on the results of the elemental analysis, it is believed that formation of the nodules was promoted by reaction of partially decomposed $Re_2(CO)_{12}$ precursor on the Re metal surface with oxygen in the ambient air.

Embodiments of the present invention provide a method for forming a passivated metal layer to inhibit growth of metal-containing nodules on a deposited Re metal layer. The method includes providing a substrate in a process chamber, exposing the substrate to a process gas containing a metal-carbonyl precursor to deposit a Re metal layer on the substrate in a chemical vapor deposition process, and forming a passivation layer on the metal layer to thereby inhibit oxygen-induced growth of metal-containing nodules on the surface of the Re metal layer. In-situ (without exposure to air) formation of the passivation layer ensures that any subsequent exposure of the metal layer to an oxygen-containing ambient will not adversely affect the properties and morphology of the underlying Re metal layer. As would be appreciated by those skilled in the art, various Re-carbonyl precursors may be employed to deposit the Re metal layer, in various combinations, without departing from the scope and spirit of the invention.

Figure 4A:
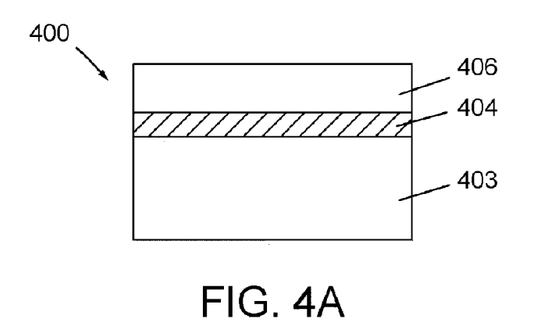
FIGS. 4A–4C show schematic cross-sectional views of a process sequence for forming a gate stack containing a passivated metal layer according to an embodiment of the invention.
Figure 4B:
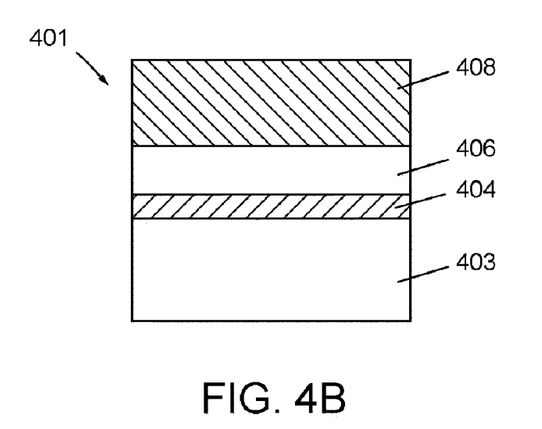
Figure 4C:
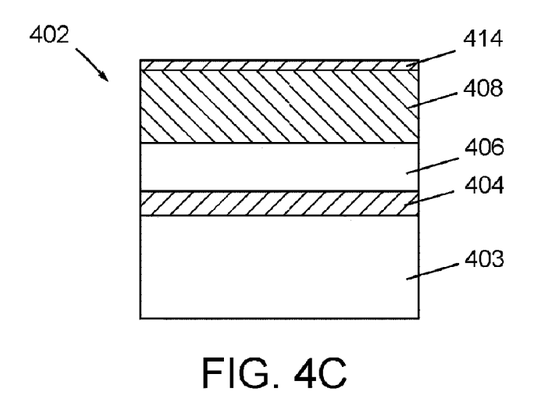

FIGS. 4A–4C show schematic cross-sectional views of a process sequence for forming a gate stack containing a passivated metal layer according to an embodiment of the invention. In FIG. 4A, the gate stack 400 includes a substrate 403, an interface layer 404, and a high-k layer 406. The substrate 403 can, for example, be a semiconductor substrate, such as a Si substrate, a Ge-containing Si substrate, a Ge substrate, or a compound semiconductor substrate, and can include numerous active devices and/or isolation regions (not shown). The substrate 403 can be of n- or p-type, depending on the type of device being formed. The interface layer 404 can, for example, be an oxide layer (e.g., $SiO_x$), a nitride layer ($SiN_x$), or an oxynitride layer (e.g., $SiO_xN_y$), that is between about 10 Å and about 30 Å thick. The high-k layer 406 can, for example, be a metal-oxide layer or a metal silicate layer, for example $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, $LaSiO_x$, $YO_x$, and $YSiO_x$. The high-k layer 406 can, for example, be about 30 Å thick. Methods for forming the gate stack 400 in FIG. 4A are well known to artisans skilled in the art of semiconductor processing. As would be appreciated by those skilled in the art, other materials may be employed, in various combinations, without departing from the scope and spirit of the invention.

FIG. 4B shows a gate stack 401 containing a metal gate electrode layer 408 on the high-k layer 406. The metal gate electrode layer 408 can contain Re. The layer 408 can be deposited in the chemical vapor deposition process from a Re-carbonyl precursor.

A process parameter space for depositing the metal layer 408 in a thermal chemical vapor deposition process can, for example, utilize a chamber pressure less than about 300 mTorr. Alternately, the pressure can be less than about 100 mTorr. A Re-carbonyl precursor flow rate can be between about 0.1 sccm to about 200 sccm, a carrier gas flow rate can be less than about 500 sccm, and a dilution gas flow rate can be less than about 2000 sccm. The carrier gas and the dilution gas can contain at least one of an inert gas or a $H_2$ gas. The inert gas can contain Ar, He, Ne, Kr, Xe, or $N_2$, or a combination of two or more thereof. The metal layers can, for example, be deposited at substrate temperatures between about 300° C. and about 600° C., or lower.

FIG. 4C shows a gate stack 402 containing a passivation layer 414 on the metal gate electrode layer 408, i.e., a passivated metal gate electrode layer, according to an embodiment of the invention. The passivation layer 414 can be between a few angstroms in thickness to several tens of angstroms in thickness. In one embodiment of the invention, the passivation layer 414 can be a metal passivation layer containing W, Ru, Ti, Ta, Ni, Mo, Co, Rh, Re, or Cr, or a combination of two or more thereof, deposited by a plasma-enhanced chemical vapor deposition process, an atomic layer deposition process, or a physical vapor deposition process. In another embodiment, the passivation layer 414 can, for example, be a metal passivation layer containing W deposited on the metal layer 408 by exposing the metal layer 408 to a corresponding metal-carbonyl precursor gas, such as $W(CO)_6$, in a thermal chemical vapor deposition process. As explained above, Re metal layers formed by thermal chemical vapor deposition from Re-carbonyl precursors are subject to nodule formation in the presence of ambients, whereas other metal layers formed from their corresponding metal-carbonyl precursors do not exhibit nodule formation. Tungsten is one example of a metal layer that may be deposited by thermal chemical vapor deposition from its metal-carbonyl precursor without exhibiting nodule formation. It may thus be appreciated that other transition metals deposited by thermal chemical vapor deposition may also be used as a passivation layer where their metal carbonyl precursors substantially or completely decompose during the thermal process so as to avoid subsequent nodule formation.

In another embodiment of the invention, the passivation layer 414 can be a silicon-containing layer or a carbon-containing layer formed on the metal layer 408. The silicon-containing layer can be formed by exposing the metal layer 408 to a silicon-containing gas containing $SiH_4$, $Si_2H_6$, $SiCl_2H_2$, or $Si_2Cl_6$, or a combination of two or more thereof. The carbon-containing layer can be formed by exposing the metal layer 408 to a carbon-containing gas containing $CH_4$, $C_2H_6$, $C_2H_4$, $C_2H_2$, $C_3H_6$, $C_2H_5OH$, $CH_3CH_2CH_2OH$, $CH_3COCH_3$, or $C_4H_8O$, or a combination of two or more thereof. As would be appreciated by those skilled in the art, other silicon-containing gases and carbon-containing gases may be employed without departing from the scope of the invention. It may be further appreciated that the term "silicon-containing layer" contemplates a pure silicon layer, as well as silicon together with impurities from the process or with metal that diffuses or migrates into the silicon from the underlying metal layer. Similarly, it may be further appreciated that the term "carbon-containing layer" contemplates a pure carbon layer, as well as carbon together with impurities from the process or with metal that diffuses or migrates into the carbon from the underlying metal layer.

In yet another embodiment of the invention, the passivation layer 414 can be a metal-containing layer, including a metal silicide layer, a metal carbide layer, a metal nitride layer, a metal oxide layer, or a metal boride layer, or a combination of two or more thereof, where the passivation layer 414 is deposited on the metal layer 408. The metal-containing layer can be a silicide, carbide, nitride, oxide or boride of W, Ru, Ti, Ta, Ni, Mo, Co, Rh, Re, Os, or Cr, or a combination of two or more thereof. The passivation layer 414 can be formed by exposing the metal layer 408 to a metal-containing gas (e.g., a metal carbonyl precursor) mixed with a silicon-containing gas, a carbon-containing gas, a boron-containing gas, a nitrogen-containing gas, or an oxygen-containing gas, or a combination of two or more thereof. The silicon-containing gas can contain $SiH_4$, $Si_2H_6$, $SiCl_2H_2$, $Si_2Cl_6$, or a combination of two or more thereof. The carbon-containing gas can contain $CH_4$, $C_2H_6$, $C_2H_4$, $C_2H_2$, $C_3H_6$, $C_3H_5OH$, $CH_3CH_2CH_2OH$, $CH_3COCH_3$, or $C_4H_8O$ (tetrahydrofuran), or a combination of two or more thereof. The nitrogen-containing gas can contain $N_2$, $NH_3$, NO, $NO_2$, or $N_2O$, or a combination of two or more thereof. The oxygen-containing gas can contain $O_2$, and the boron-containing gas can contain $BH_4$ or $B_2H_6$, or both. As would be appreciated by those skilled in the art, other silicon-containing gases, carbon-containing gases, nitrogen-containing gases, oxygen-containing gases, and boron-containing gases may be employed without departing from the scope of the invention.

Alternately, the passivation layer 414 can be formed by first depositing a thin second metal layer on the metal layer 408, and subsequently exposing the thin second metal layer to a silicon-containing gas, a carbon-containing gas, a boron-containing gas, a nitrogen-containing gas, or an oxygen-containing gas, or a combination of two or more thereof. The gas exposure can be followed by a high-temperature process (e.g., an anneal) to form the passivation layer 414 by diffusing silicon, carbon, nitrogen, oxygen, or boron atoms into the thin second metal layer formed on the metal layer 408 to convert the thin second metal layer to a metal-containing passivation layer 414, including a metal silicide, a metal carbide, a metal boride, a metal nitride and/or a metal oxide. In an exemplary embodiment, the thin second metal layer is annealed to convert it without first exposing it to ambients.

In one embodiment of the invention, the passivation layer 414 can be formed by incorporating silicon, carbon, nitrogen, oxygen, or boron, or a combination of two or more thereof, into the metal layer 408, such as into a surface portion thereof, by exposing the metal layer 408 to a silicon-containing gas, a carbon-containing gas, a nitrogen-containing gas, an oxygen-containing gas, or a boron-containing gas, or a combination of two or more thereof. Alternately, a Si layer or a C layer can be deposited onto the metal layer 408 by exposing the metal layer 408 to a silicon-containing gas or a carbon-containing gas. This can be followed by high-temperature process (e.g., anneal) to incorporate Si or C atoms into the metal layer 408, thereby forming a metal silicide or metal carbide passivation layer 414.

According to one embodiment of the invention, both the deposited metal layer 408 and the passivation layer 414 can be formed in the same processing system. This can increase the throughput of the processing tool. In another embodiment of the invention, the metal layer and the passivation layer can be formed in different processing systems of the processing tool. Hence, referring now to FIG. 2, in one example the metal layer can be deposited in processing system 220 and the passivation layer can be formed in processing system 230.

In one example of the present invention, a Re metal layer was deposited on a substrate in a thermal chemical vapor deposition process using a $Re_2(CO)_{10}$ precursor gas in a first processing system. Subsequently, the substrate was transferred in-situ (without exposure to ambient air) to a second processing system configured for depositing a W passivation layer on the Re metal layer from a $W(CO)_6$ precursor gas. Deposition of the W passivation layer was performed at a substrate (wafer) temperature of 500° C., a process chamber pressure of 150 mTorr, a $W(CO)_6$ precursor container temperature of 35° C., an Ar carrier gas flow of 200 sccm, and an Ar dilution gas flow of 700 sccm. It was observed that the W passivation layer formed on a Re metal layer did not itself exhibit module formation and prevented formation of nodules on the Re metal layer upon subsequent exposure of the gate stack to ambient air.

In another example of the present invention, a Re metal layer was deposited on a substrate in a thermal chemical vapor deposition process using $Re_2(CO)_{10}$ precursor gas in a first processing system. Subsequently, the substrate was transferred into a second processing system configured for depositing a silicon-containing passivation layer on the Re metal layer using a $SiH_4$ gas. It was observed that the silicon-containing passivation layer formed on the Re metal layer prevented formation of nodules on the Re metal layer upon exposure of the gate stack to ambient air.

In yet another example of the present invention, a Re metal layer was deposited on a substrate from a $Re_2(CO)_{10}$ precursor gas in a processing system. Subsequently, a Re-nitride passivation layer was formed on the Re metal layer by exposing the Re metal layer to a mixture of $Re_2(CO)_{10}$ precursor gas and $NH_3$ gas. Thereafter, a silicon-containing passivation layer was deposited on the Re-nitride passivation layer by exposing the Re-nitride passivation layer to a mixture of $SiH_4$ gas and $H_2$ gas. All the gas exposures were performed without exposing the substrate to ambient air. It was observed that the passivation layer containing the silicon-containing layer formed on the Re-nitride layer prevented formation of nodules on the Re metal layer upon exposure of the gate stack to ambient air.

Figure 5:
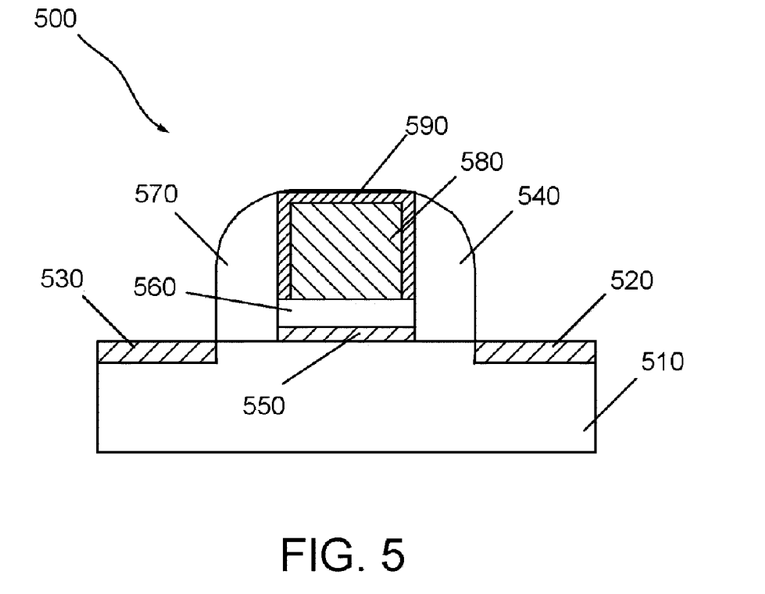
FIG. 5 shows a schematic cross-sectional view of a patterned gate electrode stack containing a passivated metal layer according to an embodiment of the invention.

FIG. 5 shows a schematic cross-sectional view of a patterned gate electrode structure containing a passivated metal layer according to an embodiment of the invention. The gate electrode structure 500 contains a substrate 510, source and drain regions 520 and 530, dielectric sidewall spacers 540 and 570, an interface layer 550, a high-k layer 560, a metal gate layer 580, and a passivation layer 590. The passivation layer 590 can be formed following deposition of the metal gate layer 580, thereby protecting the metal gate layer 580 during subsequent processing steps performed to manufacture a semiconductor device containing the gate electrode structure 500.

Figure 6:
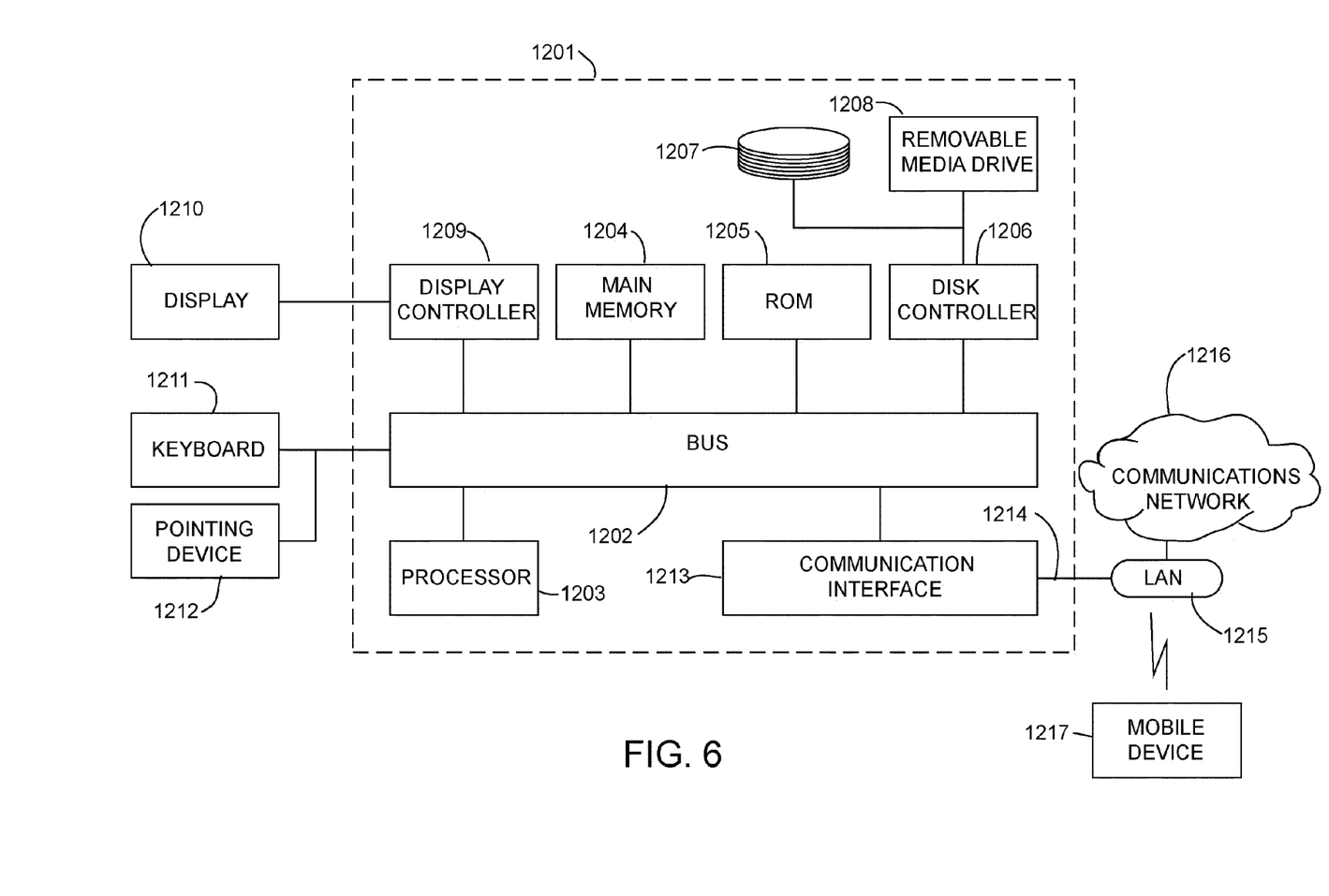
FIG. 6 shows a general-purpose computer that may be used to implement embodiments of the invention.

FIG. 6 illustrates a computer system 1201 with which an embodiment of the invention may be implemented. The computer system 1201 may be used as the controllers 140 and 240 of FIGS. 1 and 2 to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs), (not shown). The computer system may also include one or more digital signal processors (DSPs) (not shown), such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210 for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer (not shown) may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the invention includes software for controlling the computer system 1201, for driving a device or devices for implementing the invention, and for enabling the computer system 1201 to interact with a human user (e.g., processing system personnel). Such software may include, but is not limited to, device drivers, operating systems, development tools, and applications software. Such computer readable media further includes the computer program product of the invention for performing all or a portion (if processing is distributed) of the processing performed in implementing the invention.

The computer code devices of the invention may be any interpretable or executable code mechanism, including but not limited to scripts, interpretable programs, dynamic link libraries (DLLs), Java classes, and complete executable programs. Moreover, parts of the processing of the invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical film (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

The computer system 1201 may be configured to perform the method of the invention to form a passivated metal layer in a processing tool. The computer system 1201 may be further configured to depositing a metal on a substrate in a thermal chemical vapor deposition process by exposing the substrate to a process gas containing a metal-carbonyl precursor and forming a passivation layer on the metal layer.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method for forming a passivated metal layer in a gate stack of an integrated circuit, the method comprising:
   providing a semiconductor substrate in a process chamber of a processing system wherein the substrate includes a high-k dielectric layer formed on an oxide, nitride, or oxynitride interface layer;
   exposing the substrate to a process gas containing a rhenium-carbonyl precursor to deposit a rhenium metal layer on the high-k dielectric layer in a thermal chemical vapor deposition process; and
   forming a silicon-containing passivation layer or a carbon-containing passivation layer on the rhenium metal layer, wherein the passivation layer is effective to inhibit oxygen-induced growth of Re-containing nodules on a surface of the rhenium metal layer.

2. The method according to claim 1, further comprising annealing the silicon-containing passivation layer or the carbon-containing passivation layer to diffuse the silicon or carbon into at least a surface portion of the rhenium metal layer to convert the surface portion to a rhenium silicide or rhenium carbide passivation layer.

3. The method according to claim 1, wherein the rhenium metal layer and the passivation layer are formed in the same processing system.

4. The method according to claim 1, wherein the rhenium metal layer and the passivation layer are formed in different processing systems.

5. A method for forming a passivated metal layer, the method comprising:
   providing a substrate in a process chamber of a processing system;
   exposing the substrate to a process gas containing a rhenium-carbonyl precursor to deposit a rhenium metal layer on the substrate in a thermal chemical vapor deposition process; and
   exposing the rhenium metal layer to a gas containing silicon, carbon, oxygen, or boron, or a combination of two or more thereof, and annealing the substrate to diffuse the respective silicon, carbon, oxygen or boron into at least a surface portion of the rhenium metal layer to convert the surface portion to a respective rhenium silicide, rhenium carbide, rhenium oxide or rhenium boride passivation layer effective to inhibit oxygen-induced growth of Re-containing nodules on a surface of the rhenium metal layer.

6. The method according to claim 5, wherein the gas comprises $SiH_4$, $Si_2H_6$, $SiCl_2H_2$, $Si_2Cl_6$, $CH_4$, $C_2H_6$, $C_2C_4$, $C_2H_2$, $C_3H_6$, $C_2H_5OH$, $CH_3CH_2CH_2OH$, $CH_3COCH_3$, $C_4H_8O$, $O_2$, $BH_4$ or $B_2H_6$, or a combination of two or more thereof.

7. A method for forming a passivated metal layer, the method comprising:
   providing a substrate in a process chamber of a processing system;
   exposing the substrate to a process gas containing a rhenium-carbonyl precursor to deposit a rhenium metal layer on the substrate in a thermal chemical vapor deposition process; and
   forming a passivation layer on the rhenium metal layer by exposing the rhenium metal layer to a metal-carbonyl precursor gas and a silicon-containing gas, a carbon-containing gas, an oxygen-containing gas, or a boron-containing gas, or a combination of two or more thereof, whereby the passivation layer is at least one of a metal silicide layer, a metal carbide layer, a metal oxide layer, or a metal boride layer, or a combination thereof, and wherein the passivation layer is effective to inhibit oxygen-induced growth of Re-containing nodules on a surface of the rhenium metal layer.

8. The method according to claim 7, wherein the metal-carbonyl precursor comprises $W(CO)_6$, $Ru_3(CO)_{12}$, $Ni(CO)_4$, $Mo(CO)_6$, $Co_2(CO)_8$, $Rh_4(CO)_{12}$, $Re_2(CO)_{10}$, $Os_3(CO)_{12}$, or $Cr(CO)_6$, or a combination of two or more thereof, the silicon-containing gas comprises $SiH_4$, $Si_2H_6$, $SiCl_2H_2$, $Si_2Cl_6$, or a combination of two or more thereof, the carbon-containing gas comprises $CH_4$, $C_2H_6$, $C_2C_4$, $C_2H_2$, $C_3H_6$, $C_2H_5OH$, $CH_3CH_2CH_2OH$, $CH_3COCH_3$, or $C_4H_8O$, or a combination of two or more thereof, the oxygen-containing gas comprises $O_2$, and the boron-containing gas comprises $BH_4$ or $B_2H_6$, or both.

9. A method for forming a passivated Re layer, the method comprising:
   providing a substrate in a process chamber of a processing system;
   exposing the substrate to a process gas containing a rhenium carbonyl precursor to deposit a Re layer on the substrate in a chemical vapor deposition process;
   forming a tungsten passivation layer on the Re layer; and
   forming a silicon passivation layer on the tungsten passivation layer, wherein the tungsten and silicon passivation layers are effective to inhibit oxygen-induced growth of Re-containing nodules on a surface of the Re layer.

10. The method according to claim 9, wherein the tungsten passivation layer is formed in a chemical vapor deposition process by exposing the Re layer to $W(CO)_6$.

11. The method according to claim 9, wherein the silicon passivation layer is formed in a chemical vapor deposition process by exposing the tungsten passivation layer to $SiH_4$, $Si_2H_6$, $SiCl_2H_2$, or $Si_2Cl_6$, or a combination of two or more thereof.

12. The method according to claim 9, wherein the Re layer and the tungsten and silicon passivation layers are formed in the same processing system.

13. The method according to claim 9, wherein the Re layer and the tungsten and silicon passivation layers are formed in different processing systems.

14. The method according to claim 9, wherein the rhenium carbonyl precursor comprises $Re_2(CO)_{10}$.

15. The method according to claim 9, further comprising annealing the substrate to convert at least a portion of the tungsten and silicon passivation layers to a tungsten silicide passivation layer.

16. A method for forming a passivated metal layer, the method comprising:
   providing a substrate in a process chamber of a processing system;
   exposing the substrate to a process gas containing a rhenium-carbonyl precursor to deposit a rhenium metal layer on the substrate in a thermal chemical vapor deposition process; and
   forming a passivation layer on the rhenium metal layer by:
      first, forming a metal layer on the rhenium metal layer,
      second, exposing the metal layer to a silicon-containing gas, a carbon-containing gas, a nitrogen-containing gas, an oxygen-containing gas, or a boron-containing gas, or a combination of two or more thereof, and
      third, diffusing the silicon, carbon, nitrogen, oxygen and/or boron into the metal layer to convert the metal layer to a metal silicide, a metal carbide, a metal nitride, a metal oxide and/or a metal boride,
   wherein the passivation layer is effective to inhibit oxygen-induced growth of Re-containing nodules on a surface of the rhenium metal layer.

* * * * *

UNITED STATES PATENT AND TRADEMARK OFFICE
CERTIFICATE OF CORRECTION

PATENT NO. : 7,189,431 B2
APPLICATION NO. : 10/711717
DATED : March 13, 2007
INVENTOR(S) : Yamasaki et al.

It is certified that error appears in the above-identified patent and that said Letters Patent is hereby corrected as shown below:

Col. 2, Line 12, "thereby inhibiting" should read --thereby inhibit--.
Col. 8, Line 28, "$C_3H_5OH$," should read --$C_2H_5OH$,--.
Col. 9, Line 28, "module" should read --nodule--.
Col. 10, Line 37, "arrays (FPGAs), (not shown)" should read --arrays (FPGAs)), (not shown)--.
Col. 12, Line 35, "maybe" should read --may be--.
Col. 12, Line 54, "assistant (PDA) laptop" should read --assistant (PDA), laptop--.
Col. 12, Line 58, "configured to depositing" should read --configured to deposit--.
Col. 14, Line 7, "$C_2C_4$" should read --$C_2H_4$--.

Signed and Sealed this

Twenty-fifth Day of December, 2007

JON W. DUDAS
*Director of the United States Patent and Trademark Office*